United States Patent
Tu et al.

(10) Patent No.: US 10,446,687 B2
(45) Date of Patent: Oct. 15, 2019

(54) INTEGRATED CIRCUIT CONNECTION ARRANGEMENT FOR MINIMIZING CROSSTALK

(71) Applicant: Silanna Asia Pte Ltd, Singapore (SG)

(72) Inventors: Shanghui Larry Tu, San Diego, CA (US); Michael A. Stuber, Rancho Santa Fe, CA (US); Befruz Tasbas, San Diego, CA (US); Stuart B. Molin, Carlsbad, CA (US); Raymond Jiang, Raleigh, NC (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 16/252,168

(22) Filed: Jan. 18, 2019

(65) Prior Publication Data

US 2019/0157446 A1 May 23, 2019

Related U.S. Application Data

(62) Division of application No. 15/853,357, filed on Dec. 22, 2017, now Pat. No. 10,192,989.

(Continued)

(51) Int. Cl.
*H01L 29/786* (2006.01)
*H01L 29/10* (2006.01)
(Continued)

(52) U.S. Cl.
CPC ........ *H01L 29/786* (2013.01); *H01L 21/4825* (2013.01); *H01L 21/4853* (2013.01);
(Continued)

(58) Field of Classification Search
CPC ......... H01L 24/40; H01L 24/41; H01L 24/49; H01L 24/84; H01L 25/50
See application file for complete search history.

(56) References Cited

U.S. PATENT DOCUMENTS 4,738,936 A 4/1988 Rice
5,365,102 A 11/1994 Mehrotra et al.
(Continued)

FOREIGN PATENT DOCUMENTS

DE 19647324 A1 5/1997
KR 20100087115 A 8/2010
(Continued)

OTHER PUBLICATIONS

Corrected Notice of Allowance dated Dec. 19, 2018 for U.S. Appl. No. 15/899,911.

(Continued)

*Primary Examiner* — Walter H Swanson
(74) *Attorney, Agent, or Firm* — MLO, a professional corp.

(57) ABSTRACT

A semiconductor package includes a leadframe, having perimeter package leads and a ground voltage lead, a bottom semiconductor die flip-chip mounted to the leadframe, and a top semiconductor die. The bottom semiconductor die has a first frontside active layer with first frontside electrical contacts electrically connected to the leadframe, a first backside portion, and a buried oxide layer situated between the first frontside active layer and the first backside portion. The top semiconductor die is mounted to the first backside portion. The first frontside active layer includes a circuit electrically connected to the first backside portion by a backside electrical connection through the buried oxide layer. The first backside portion of the bottom semiconductor die is electrically connected to the ground voltage lead through a first electrical contact of the first frontside electrical contacts to minimize crosstalk.

9 Claims, 5 Drawing Sheets

Related U.S. Application Data

(60) Provisional application No. 62/461,117, filed on Feb. 20, 2017.

(51) Int. Cl.

| | | |
|---|---|---|
| H01L 27/12 | (2006.01) | |
| H01L 29/78 | (2006.01) | |
| H01L 29/06 | (2006.01) | |
| H01L 21/84 | (2006.01) | |
| H01L 21/74 | (2006.01) | |
| H01L 29/66 | (2006.01) | |
| H01L 21/48 | (2006.01) | |
| H01L 21/768 | (2006.01) | |
| H01L 23/48 | (2006.01) | |
| H01L 23/495 | (2006.01) | |
| H01L 23/00 | (2006.01) | |
| H01L 29/417 | (2006.01) | |
| H01L 23/522 | (2006.01) | |
| H01L 23/535 | (2006.01) | |
| H01L 25/00 | (2006.01) | |
| H01L 23/485 | (2006.01) | |

(52) U.S. Cl.
CPC ...... *H01L 21/743* (2013.01); *H01L 21/76898* (2013.01); *H01L 21/84* (2013.01); *H01L 23/481* (2013.01); *H01L 23/4951* (2013.01); *H01L 23/49513* (2013.01); *H01L 23/49517* (2013.01); *H01L 23/49524* (2013.01); *H01L 23/49541* (2013.01); *H01L 23/49568* (2013.01); *H01L 23/49575* (2013.01); *H01L 23/5225* (2013.01); *H01L 23/535* (2013.01); *H01L 24/40* (2013.01); *H01L 24/41* (2013.01); *H01L 24/49* (2013.01); *H01L 24/73* (2013.01); *H01L 24/84* (2013.01); *H01L 25/50* (2013.01); *H01L 27/1203* (2013.01); *H01L 27/1207* (2013.01); *H01L 29/0649* (2013.01); *H01L 29/1087* (2013.01); *H01L 29/1095* (2013.01); *H01L 29/41766* (2013.01); *H01L 29/66659* (2013.01); *H01L 29/66681* (2013.01); *H01L 29/66696* (2013.01); *H01L 29/7816* (2013.01); *H01L 29/7824* (2013.01); *H01L 29/7835* (2013.01); *H01L 23/485* (2013.01); *H01L 23/49562* (2013.01); *H01L 24/32* (2013.01); *H01L 24/48* (2013.01); *H01L 2224/32245* (2013.01); *H01L 2224/4001* (2013.01); *H01L 2224/40141* (2013.01); *H01L 2224/40245* (2013.01); *H01L 2224/48091* (2013.01); *H01L 2224/48108* (2013.01); *H01L 2224/48247* (2013.01); *H01L 2224/73213* (2013.01); *H01L 2224/73265* (2013.01)

(56) References Cited

U.S. PATENT DOCUMENTS

| | | | |
|---|---|---|---|
| 5,378,912 A | 1/1995 | Pein | |
| 5,382,818 A | 1/1995 | Pein | |
| 5,521,414 A | 5/1996 | Palara | |
| 5,548,150 A | 8/1996 | Omura et al. | |
| 5,559,044 A | 9/1996 | Williams et al. | |
| 5,773,852 A | 6/1998 | Han et al. | |
| 5,869,875 A | 2/1999 | Hebert | |
| 5,889,310 A | 3/1999 | Terashima et al. | |
| 6,025,237 A | 2/2000 | Choi | |
| 6,049,108 A | 4/2000 | Williams et al. | |
| 6,078,090 A | 6/2000 | Williams et al. | |
| 6,084,284 A | 7/2000 | Adamic | |
| 6,294,838 B1 | 9/2001 | Peng | |
| 6,476,442 B1 | 11/2002 | Williams et al. | |
| 6,692,998 B2 | 2/2004 | Maciejewski et al. | |
| 6,794,719 B2 | 9/2004 | Petruzzello et al. | |
| 7,008,821 B1 | 3/2006 | Shao et al. | |
| 7,235,845 B2 | 6/2007 | Xu et al. | |
| 7,273,771 B2 | 9/2007 | Kinzer | |
| 7,282,765 B2 | 10/2007 | Xu et al. | |
| 7,420,247 B2 | 9/2008 | Xu et al. | |
| 7,446,375 B2 | 11/2008 | Xu et al. | |
| 7,560,808 B2 | 7/2009 | Korec et al. | |
| 7,576,388 B1 | 8/2009 | Wilson et al. | |
| 7,589,378 B2 | 9/2009 | Kocon et al. | |
| 7,598,128 B2 | 10/2009 | Hsu et al. | |
| 7,629,645 B2 | 12/2009 | Montanini et al. | |
| 7,713,821 B2 | 5/2010 | Hsu et al. | |
| 7,719,054 B2 | 5/2010 | Williams et al. | |
| 7,745,846 B2 | 6/2010 | Korec et al. | |
| 7,745,920 B2 | 6/2010 | Lee et al. | |
| 7,829,947 B2 | 11/2010 | Hébert | |
| 7,842,568 B2 | 11/2010 | Anderson et al. | |
| 7,952,145 B2 | 5/2011 | Korec et al. | |
| 8,101,993 B2 | 1/2012 | Hsieh | |
| 8,198,154 B2 | 6/2012 | Hebert | |
| 8,674,440 B2 | 3/2014 | Korec et al. | |
| 8,847,310 B1 | 9/2014 | Korec | |
| 8,928,116 B2 | 1/2015 | Korec et al. | |
| 8,994,105 B2 | 3/2015 | Korec | |
| 8,994,115 B2 | 3/2015 | Korec et al. | |
| 9,159,825 B2 | 10/2015 | Molin et al. | |
| 9,324,838 B2 | 4/2016 | Cascino et al. | |
| 9,349,677 B2 | 5/2016 | Cho et al. | |
| 9,373,571 B2 | 6/2016 | Denison et al. | |
| 9,412,881 B2 | 8/2016 | Korec et al. | |
| 9,412,911 B2 | 8/2016 | Atankackovic | |
| 9,466,536 B2 | 10/2016 | Goktepeli et al. | |
| 9,524,957 B2 | 12/2016 | Hebert et al. | |
| 9,530,796 B2 | 12/2016 | Stuber et al. | |
| 9,583,477 B2 | 2/2017 | Cho et al. | |
| 9,589,929 B2 | 3/2017 | Terrill et al. | |
| 2002/0017697 A1 | 2/2002 | Kitamura et al. | |
| 2003/0094654 A1 | 5/2003 | Christensen et al. | |
| 2004/0201061 A1 | 10/2004 | Jeon et al. | |
| 2004/0238913 A1 | 12/2004 | Kwon et al. | |
| 2004/0245633 A1 | 12/2004 | Alter et al. | |
| 2006/0001110 A1 | 1/2006 | Igarashi | |
| 2006/0261382 A1 | 11/2006 | Khemka et al. | |
| 2007/0034942 A1 | 2/2007 | Xu et al. | |
| 2007/0080431 A1 | 4/2007 | Hung et al. | |
| 2007/0108469 A1 | 5/2007 | Nakano et al. | |
| 2007/0138548 A1 | 6/2007 | Kocon et al. | |
| 2007/0235769 A1 | 10/2007 | La Rosa et al. | |
| 2008/0012043 A1 | 1/2008 | Udrea et al. | |
| 2008/0023785 A1 | 1/2008 | Hebert | |
| 2008/0038912 A1* | 2/2008 | Hess | ............... H01L 23/49517 438/597 |
| 2008/0122006 A1 | 5/2008 | Williams et al. | |
| 2008/0150094 A1 | 6/2008 | Anderson | |
| 2008/0197411 A1 | 8/2008 | Korec et al. | |
| 2008/0246086 A1 | 10/2008 | Korec et al. | |
| 2008/0315304 A1 | 12/2008 | Hsu et al. | |
| 2009/0179264 A1 | 7/2009 | Korec et al. | |
| 2009/0273029 A1 | 11/2009 | Tien et al. | |
| 2010/0002374 A1 | 1/2010 | Sasagawa et al. | |
| 2010/0025763 A1 | 2/2010 | Paul et al. | |
| 2010/0127347 A1 | 5/2010 | Quinn | |
| 2010/0171543 A1 | 7/2010 | Korec et al. | |
| 2010/0237414 A1 | 9/2010 | Hsieh | |
| 2010/0301413 A1 | 12/2010 | You | |
| 2010/0314683 A1 | 12/2010 | Yanagi | |
| 2010/0315159 A1 | 12/2010 | Kocon et al. | |
| 2011/0024839 A1 | 2/2011 | Zinn et al. | |
| 2011/0084314 A1 | 4/2011 | Or-Bach et al. | |
| 2011/0127602 A1 | 6/2011 | Mallikarjunaswamy | |
| 2011/0148376 A1 | 6/2011 | Xu et al. | |
| 2011/0148506 A1 | 6/2011 | Korec et al. | |
| 2011/0198927 A1 | 8/2011 | Korec et al. | |
| 2011/0241170 A1 | 10/2011 | Haeberlen et al. | |
| 2011/0292632 A1 | 12/2011 | Wen et al. | |
| 2011/0303976 A1 | 12/2011 | Kocon et al. | |
| 2011/0309438 A1 | 12/2011 | Ichijo et al. | |

(56) References Cited

U.S. PATENT DOCUMENTS

| | | | |
|---|---|---|---|
| 2012/0012982 | A1 | 1/2012 | Korec et al. |
| 2012/0032262 | A1 | 2/2012 | Toren et al. |
| 2012/0181681 | A1 | 7/2012 | Cho et al. |
| 2012/0220091 | A1 | 8/2012 | Challa et al. |
| 2012/0299119 | A1 | 11/2012 | Xue et al. |
| 2013/0009253 | A1 | 1/2013 | Wang et al. |
| 2014/0002935 | A1* | 1/2014 | Chen .................. H05K 1/0245 361/56 |
| 2014/0035047 | A1 | 2/2014 | Korec et al. |
| 2014/0061884 | A1 | 3/2014 | Carpenter et al. |
| 2014/0167269 | A1 | 6/2014 | Lu et al. |
| 2014/0210107 | A1 | 7/2014 | Zhai |
| 2014/0264611 | A1 | 9/2014 | Lee et al. |
| 2014/0273344 | A1 | 9/2014 | Terrill et al. |
| 2016/0064361 | A1 | 3/2016 | Denison et al. |
| 2017/0221885 | A1 | 8/2017 | Sander et al. |

FOREIGN PATENT DOCUMENTS

| | | | |
|---|---|---|---|
| KR | 20130119439 | A | 10/2013 |
| TW | 200805510 | A | 1/2008 |
| TW | 201133856 | A | 10/2011 |
| WO | 2003036699 | A3 | 9/2003 |

OTHER PUBLICATIONS

International Search Report dated May 16, 2018 for PCT Patent Application No. PCT/IB2018/050905.
International Search Report dated May 21, 2018 for PCT Patent Application No. PCT/IB2018/050907.
International Search Report dated May 21, 2018 for PCT Patent Application No. PCT/IB2018/050909.
Nenadovic, et al., "RF Power Silicon-On-Glass VDMOSFETs," IEEE, vol. 25, No. 6, Jun. 2004, pp. 424-426.
Nenadovic, et al., "VDMOS and LDMOS transistors for RF-power applications," ResearchGate, Nov. 2002, pp. 61-68.
Notice of Allowance dated May 29, 2018 for U.S. Appl. No. 15/640,081.
Notice of Allowance dated Nov. 28, 2018 for U.S. Appl. No. 15/899,911.
Notice of Allowance dated Nov. 9, 2017 for U.S. Appl. No. 15/588,357.
Notice of Allowance dated Sep. 26, 2018 for U.S. Appl. No. 15/853,357.
Office Action dated Dec. 15, 2017 for U.S. Appl. No. 15/640,081.
Office Action dated Sep. 5, 2017 for U.S. Appl. No. 15/588,357.
Yuanzheng Zhu et al., "Folded Gate LDMOS Transistor with Low On-Resistance and High Transconductance," IEEE vol. 48, No. 12, Dec. 2001, pp. 2917-2928.

* cited by examiner

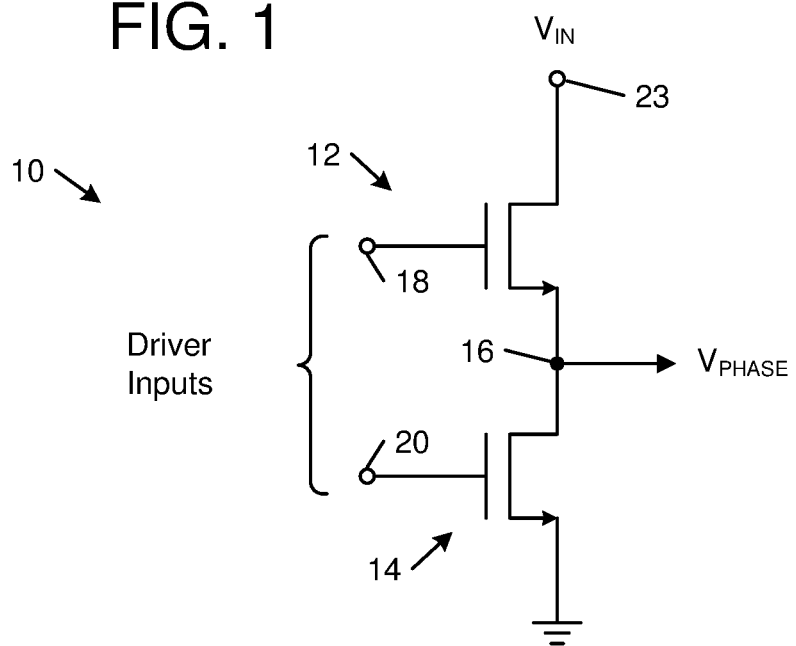

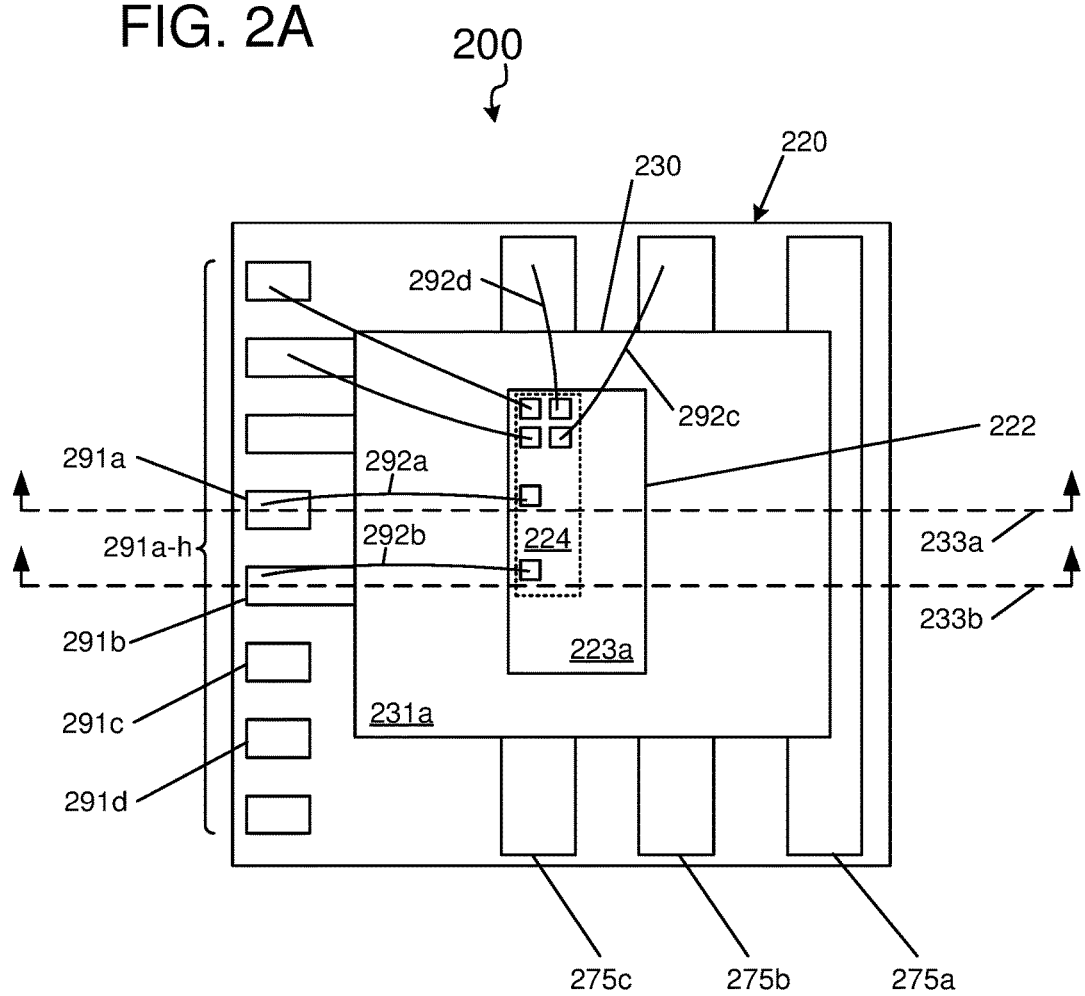

INTEGRATED CIRCUIT CONNECTION ARRANGEMENT FOR MINIMIZING CROSSTALK

CROSS-REFERENCE TO RELATED APPLICATION

This application is a divisional of U.S. patent application Ser. No. 15/853,357, filed Dec. 22, 2017 and entitled "Integrated Circuit Connection Arrangement For Minimizing Crosstalk," which claims the benefit of U.S. Provisional Application No. 62/461,117, filed Feb. 20, 2017, and entitled "Backside Contact Integrated Laterally Diffused MOS Apparatus and Methods," all of which are incorporated by reference herein in their entirety.

BACKGROUND

Semiconductor power devices are specialized devices that are typically used as switches or rectifiers in power electronics circuits. Semiconductor power devices may be implemented using lateral diffusion field effect transistors (LDFETs), such as lateral diffusion metal oxide semiconductor (LDMOS) transistors. These types of transistors are characterized by a "lateral diffusion" region (or low-doped or lightly-doped drain (LDD) region) that corresponds to an extension of the drain region that is less strongly doped than the core drain region, and that extends laterally away from the channel. The lateral diffusion region increases an LDFET's ability to handle higher voltages in the off-state by absorbing portions of the electric field that would otherwise cause source-drain punch-through, and to handle larger currents in the on-state by preventing a large potential drop from building up at the drain-body interface which would otherwise result in degradation of the device via the injection of hot carriers into the body of the device.

A switching voltage regulator typically includes two semiconductor power devices that constantly switch on and off in a synchronized manner to regulate a voltage. This switching may create electrical interference that negatively impacts surrounding circuitry, manifesting, in some cases, as crosstalk. Crosstalk is a phenomenon caused by undesirable (e.g., inductive, capacitive, or conductive) coupling from one circuit to another. In tightly-packed semiconductor packages where integrated circuits for control of power electronics circuits are packaged along with the power electronic circuits themselves, crosstalk between the power electronic circuits and the controller circuits may result in undesirable system performance or behaviors.

SUMMARY

In some embodiments, an integrated circuit (IC) package includes a leadframe having perimeter package leads and a ground voltage lead, a bottom semiconductor die, and a top semiconductor die. The bottom semiconductor die is flip-chip mounted to the leadframe. The bottom semiconductor die includes: i) a first frontside active layer having first frontside electrical contacts electrically connected to the leadframe, ii) a first backside portion, and iii) a buried oxide layer. The buried oxide layer is situated between the first frontside active layer and the first backside portion. The top semiconductor die includes: i) a second frontside, and ii) a second backside. The second backside of the top semiconductor die is mounted to the first backside portion of the bottom semiconductor die. The first frontside active layer of the bottom semiconductor die includes a circuit electrically connected to the first backside portion by a backside electrical connection through the buried oxide layer. A first electrical contact of the first frontside electrical contacts is electrically connected to the backside electrical connection, and the first backside portion of the bottom semiconductor die is electrically connected to the ground voltage lead of the leadframe through the first electrical contact to minimize crosstalk.

In some embodiments, a method for packaging a semiconductor device in an IC package involves providing a leadframe having perimeter package leads and a ground voltage lead. A bottom semiconductor die is formed, the bottom semiconductor die including: i) a first frontside active layer having first frontside electrical contacts, ii) a first backside portion, and iii) a buried oxide layer. The buried oxide layer is situated between the first frontside active layer and the first backside portion. The bottom semiconductor die is flip-chip mounted to the leadframe. The flip-chip mounting comprises electrically connecting and physically mounting the first frontside electrical contacts of the bottom semiconductor die to the leadframe, a first electrical contact of the first frontside electrical contacts being electrically connected and physically mounted to the ground voltage lead of the leadframe. A top semiconductor die is provided. The top semiconductor die includes: i) a second frontside having second frontside electrical contacts, and ii) a second backside. The top semiconductor die is mounted to the bottom semiconductor die, the second backside of the top semiconductor die being attached to the first backside portion of the bottom semiconductor die. The first frontside active layer of the bottom semiconductor die includes a circuit electrically connected to the first frontside electrical contacts by respective first frontside electrical connections and electrically connected to the first backside portion by a first backside connection through the buried oxide layer. The first backside portion of the bottom semiconductor die is electrically connected to the ground voltage lead of the leadframe through the first backside connection and the first electrical contact of the first frontside electrical contacts to minimize crosstalk.

DESCRIPTION OF DRAWINGS

FIG. 1 is a circuit diagram of an example of a high-power semiconductor switch incorporating some embodiments.

FIG. 2A is a simplified diagrammatic top orthographic view of an integrated circuit package, in accordance with some embodiments.

DETAILED DESCRIPTION

Figure 2B:
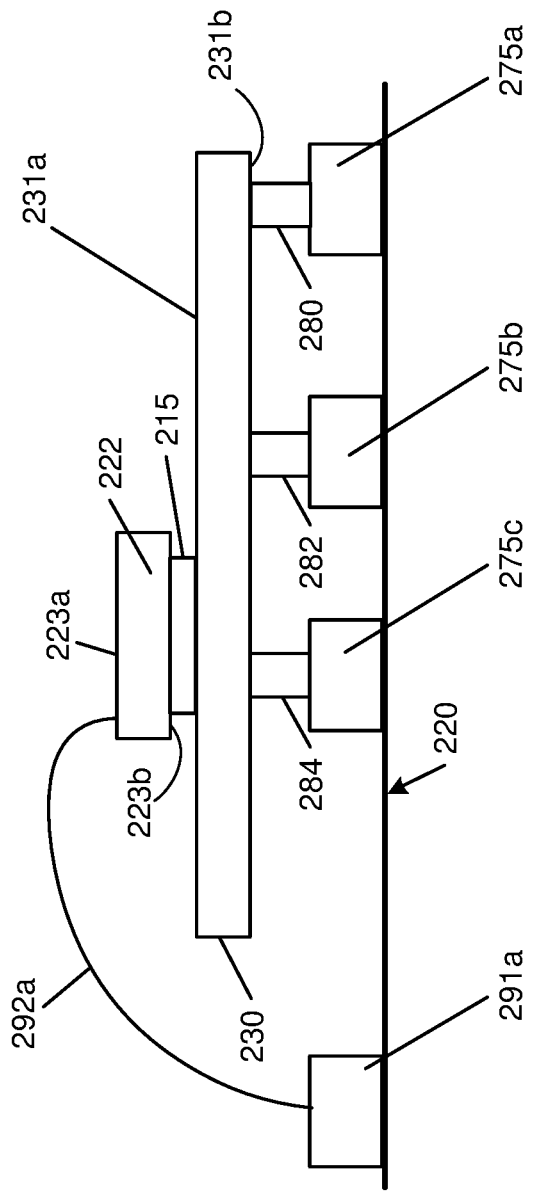
FIG. 2B is a simplified diagrammatic cross-section of an integrated circuit package, in accordance with some embodiments.

In the following description, like reference numbers are used to identify like elements. Furthermore, the drawings are intended to illustrate major features of example embodiments in a diagrammatic manner. The drawings are not intended to depict every feature of actual embodiments nor relative dimensions of the depicted elements and are not drawn to scale.

Some embodiments described herein provide a semiconductor device that includes a top semiconductor die mounted on top of a bottom semiconductor die. The bottom semiconductor die is flip-chip mounted onto a leadframe of a semiconductor device package such that a backside portion of the bottom semiconductor die is oriented up, and a frontside portion of the bottom semiconductor die is oriented down.

The backside portion of the bottom semiconductor die includes a semiconductor substrate, such as a handle wafer. The backside portion of the bottom semiconductor is electrically connected to a ground lead of the leadframe through an electrical contact of the frontside portion of the bottom semiconductor die. In some embodiments, this electrical connection includes a conductive path through a buried insulator layer of the bottom semiconductor. The backside portion of the bottom semiconductor, thus grounded, advantageously creates a ground plane situated below the top semiconductor die and above a frontside active layer of the bottom semiconductor die. The presence of this ground plane advantageously minimizes crosstalk between the top semiconductor die and the bottom semiconductor die.

In some embodiments, the top semiconductor die is a controller die that provides control signals to circuit nodes (e.g., gate nodes of transistors) formed in the bottom semiconductor die. In some embodiments, the bottom semiconductor die includes integrated lateral diffusion field effect transistor (LDFET) circuits. Such LDFET circuits include at least one substrate contact to the backside portion of the bottom semiconductor die to reduce the number of required frontside electrical connections. In this way, frontside space of the bottom semiconductor die available to accommodate relatively large, high performance, electrical connections (e.g., electrical connectors of a leadframe, such as metal strips capable of conducting high currents) is increased. This, in turn, increases circuit design flexibility, performance, and manufacturability of integrated LDFET power device circuits. In some embodiments, an LDFET that has a substrate contact is electrically isolated from other LDFETs in the same circuit to further improve the performance of the circuit by preventing the formation of a common node between the LDFETs that are connected to the substrate and those that are not.

For illustrative purposes only, this disclosure describes specific examples of single-semiconductor-die integrated LDFET circuits in the context of embodiments similar to an example high-power semiconductor switch circuit 10 shown in FIG. 1. The same or similar teachings may be used to fabricate other single-semiconductor-die integrated LDFET circuits that are suitable for both power and non-power applications.

The high-power semiconductor switch circuit 10 includes a high-side field effect transistor (FET) 12 and a low-side FET 14. The high-side source of the high-side FET 12 is coupled to the low-side drain of the low-side FET 14 at a phase node 16 ($V_{PHASE}$). The high-side gate node 18 and the low-side gate node 20 control the duty cycles of the high-side FET 12 and the low-side FET 14 to convert the input voltage ($V_{IN}$) at the voltage input node 23 at a high-side drain of the high-side FET 12 to an output voltage ($V_{PHASE}$) at the phase node 16. In general, the FETs 12, 14 may be fabricated using any of a wide variety of semiconductor material systems and technologies, including silicon, germanium, and compound semiconductor technologies.

FIG. 2A shows a top orthographic view of a simplified example of a portion of an integrated circuit (IC) package 200 that generally includes a leadframe 220, a top semiconductor die 222, and a bottom semiconductor die 230, in accordance with some embodiments. The IC package 200 also generally includes bond-wires 292a-d.

In general, the leadframe 220 includes electrical connectors 275a-c and perimeter package leads 291a-h. The number of electrical connectors and/or perimeter package leads shown in FIG. 2A, or in any of the figures herein, are shown as a simplified example. In some embodiments, more or fewer electrical connectors and/or perimeter package leads may be used. Cross-section cutting lines 233a-b are discussed later with reference to FIGS. 2B-C.

In the example shown, the bottom semiconductor die 230 embodies an integrated point-of-load (POL) voltage converter, embodying an example implementation of the high-power semiconductor switch circuit 10 shown in FIG. 1. However, the semiconductor device of the bottom semiconductor die 230 could be another semiconductor device as is known in the art. In the example shown, the bottom semiconductor die 230 generally includes a backside portion 231a (e.g., a handle wafer) and a frontside (231b shown in FIG. 2B) opposite the backside portion.

The top semiconductor die 222 generally includes top electrical contacts 224 on a frontside 223a, and a backside portion (e.g., a substrate such as a handle wafer) (223b shown in FIG. 2B) that is opposite the frontside 223a. In some embodiments, the top semiconductor die 222 is one of: (i) a controller die, (ii) a bulk semiconductor die, (iii) a microprocessor, (iv) a microcontroller, (v) a digital signal processor, or (vi) another semiconductor as is known in the art. In the example embodiments described herein, the top semiconductor die 222 is a controller die for a power switch circuit. In this case, the top semiconductor die 222 is configured to synchronize the respective on/off states of transistors of the POL voltage converter of the bottom semiconductor die 230.

As shown, the backside of the top semiconductor die 222, opposite the frontside 223a, is physically mounted to the backside portion 231a of the bottom semiconductor die 230. Respective electrical contacts (shown in FIG. 2B and FIG. 2C) of the frontside of the bottom semiconductor die 230, opposite the backside portion 231a, are electrically coupled to and physically mounted to the electrical connectors 275a-c of the leadframe. The backside portion 231a of the bottom semiconductor die 230 advantageously creates a ground plane, upon which the top semiconductor die 222 is mounted, thus reducing crosstalk between the top semiconductor die 222 and the bottom semiconductor die 230.

One or more of the top electrical contacts 224 of the top semiconductor die 222 are electrically coupled to one or more of the perimeter package leads 291a-h, to the leadframe 220, and/or to the bottom semiconductor die 230 to receive or send signals, commands and/or feedback for control of the electronic components, e.g., transistors, of the high-power semiconductor switch circuit in the bottom semiconductor die 230. By way of example, contacts of the top electrical contacts 224 of the top semiconductor die 222 are electrically connected to the perimeter package leads 291a-b by the bond-wires 292a-b, and the electrical connectors 275b-c by the bond-wires 292c-d.

FIG. 2B shows a diagrammatic cross-section view of a portion of the simplified example integrated circuit (IC) package 200 including the leadframe 220 for a semiconductor device that was introduced in FIG. 2A, in accordance with some embodiments. The cross-section view of the IC package 200 is a cross-section taken through a portion of the IC package 200 of FIG. 2A indicated by the cutting line 233a of FIG. 2A.

The IC package 200 of FIG. 2B includes the elements introduced in FIG. 2A, as well as mounting medium 215, a backside 223b of the top semiconductor die 222, and a frontside 231b of the bottom semiconductor die 230.

As shown, the bond-wire 292a electrically couples the perimeter package lead 291a to a frontside electrical contact of the top electrical contacts 224 of the top semiconductor die 222. The backside 223b of the top semiconductor die 222 is physically mounted to the backside portion 231a of the bottom semiconductor die 230 by the mounting medium 215. In some embodiments, the mounting medium 215 includes die attach adhesive, sintered silver, solder paste, thermally conductive adhesive, or any substance suitable for forming physical, thermal and/or electrical connections. In some embodiments, the mounting medium 215 is an electrically insulating material. In some embodiments, one or more other intervening layers (e.g., a metal layer or an insulating layer) are situated between the top semiconductor die 222 and the bottom semiconductor die 230.

In some embodiments, frontside electrical contacts of the bottom semiconductor die 230 include copper pillars or solder bumps. A first frontside electrical contact 280 of the bottom semiconductor die 230 is electrically connected and physically mounted to the electrical connector 275a, a second frontside electrical contact 282 of the bottom semiconductor die 230 is electrically connected and physically mounted to the electrical connector 275b, and a third frontside electrical contact 284 of the bottom semiconductor die 230 is electrically connected and physically mounted to the electrical connector 275c (e.g., each by a die-attach adhesive or other suitable mounting technique).

In some embodiments, the first frontside electrical contact 280, the second frontside electrical contact 282, and the third frontside electrical contact 284 of the bottom semiconductor die 230 generally represent top metal layers of multiple metal layers of the bottom semiconductor die 230. The bottom semiconductor die 230 is inverted, or in a flip-chip configuration, so the "top"/"frontside" and the "bottom"/"backside" of the bottom semiconductor die 230 are shown on the bottom and top, respectively, in the drawing. Some metal layers, connections, bond-wires, or other features have been omitted for simplicity. Intervening metal layers, conductive adhesive, copper pillars, solder bumps, or other metal bonding structures may be present.

In some embodiments, at least five electrical connections are made between the bottom semiconductor die 230, the leadframe 220, and/or the top semiconductor die 222. With reference to FIG. 1, these five electrical connections include an electrical connection to the voltage input node 23 ($V_{IN}$), an electrical connection to the phase node 16 ($V_{PHASE}$), an electrical connection of a low-side source of the low-side FET 14 to the ground node, an electrical connection to the high-side gate node 18, and an electrical connection to the low-side gate node 20.

In some embodiments, a backside electrical contact (not shown) on the backside 223b of the top semiconductor die 222 is electrically coupled to the backside portion 231a of the bottom semiconductor die 230. In some embodiments in which the mounting medium 215 is electrically conductive, the mounting medium 215 is used for this electrical coupling. In other embodiments in which the mounting medium 215 is electrically insulating, the backside 223b of the top semiconductor die 222 is substantially electrically isolated from the backside portion 231a of the bottom semiconductor die 230 by the mounting medium 215. In either embodiment, the backside portion 231a of the bottom semiconductor die 230 advantageously provides a ground plane for minimizing crosstalk between the top semiconductor die 222, and the bottom semiconductor die 230.

Figure 2C:
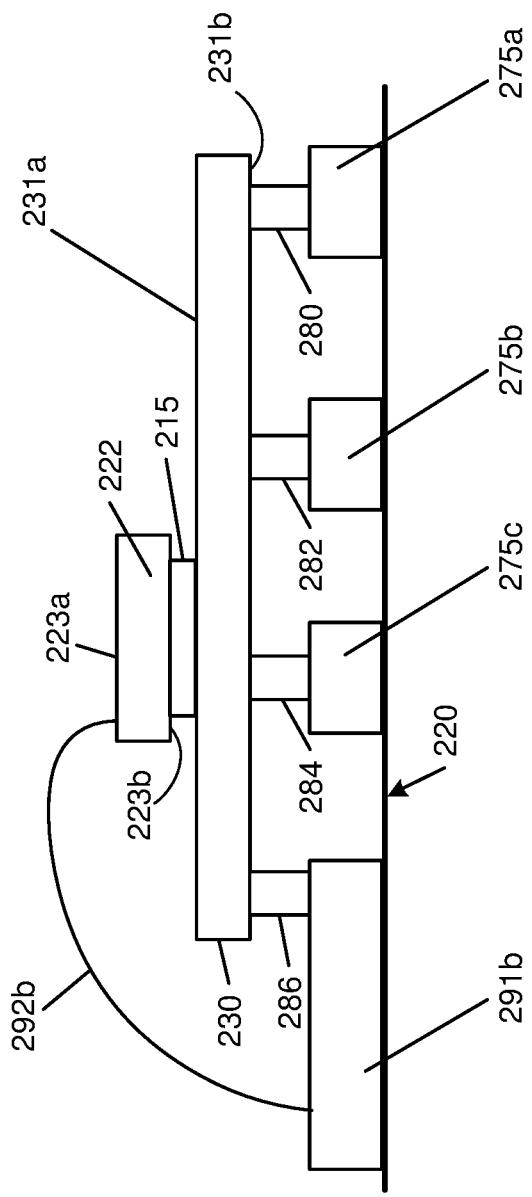
FIG. 2C is a simplified diagrammatic cross-section of an integrated circuit package, in accordance with some embodiments.

FIG. 2C shows a diagrammatic cross-section view of a portion of the simplified example integrated circuit (IC) package 200 including the leadframe 220 for a semiconductor device, in accordance with some embodiments. The cross-section view of the IC package 200 shown in FIG. 2C is a cross-section taken through a portion of the IC package 200 of FIG. 2A indicated by the cutting line 233b of FIG. 2A.

The IC package 200 of FIG. 2C includes the elements introduced in FIGS. 2A-B, as well as a fourth frontside electrical contact 286 of the bottom semiconductor die 230. In some embodiments, the fourth frontside electrical contact 286 is electrically coupled to a gate contact of a transistor of the bottom semiconductor die 230. As shown, the fourth frontside electrical contact 286 is electrically coupled to and physically mounted to the perimeter package lead 291b, which extends under the bottom semiconductor die 230. Although the fourth frontside electrical contact 286 is shown physically mounted to the perimeter package lead 291b, in other embodiments, the fourth frontside electrical contact 286 is electrically coupled to the perimeter package lead 291b (e.g., by bond-wire), but is not physically mounted to the perimeter package lead 291b.

In the embodiment shown, the bond-wire 292b electrically couples the perimeter package lead 291b to a frontside electrical contact of the top electrical contacts 224 of the top semiconductor die 222 and thereby electrically couples the fourth frontside electrical contact 286 to the frontside electrical contact of the top semiconductor die 222.

In some embodiments, the fourth frontside electrical contact 286 generally represents a top metal layer of multiple metal layers of the bottom semiconductor die 230. Some metal layers, connections, bond-wires, or other features have been omitted for simplicity. Intervening metal layers, conductive adhesive, copper pillars, solder bumps, or other metal bonding structures may be present.

Figure 3:
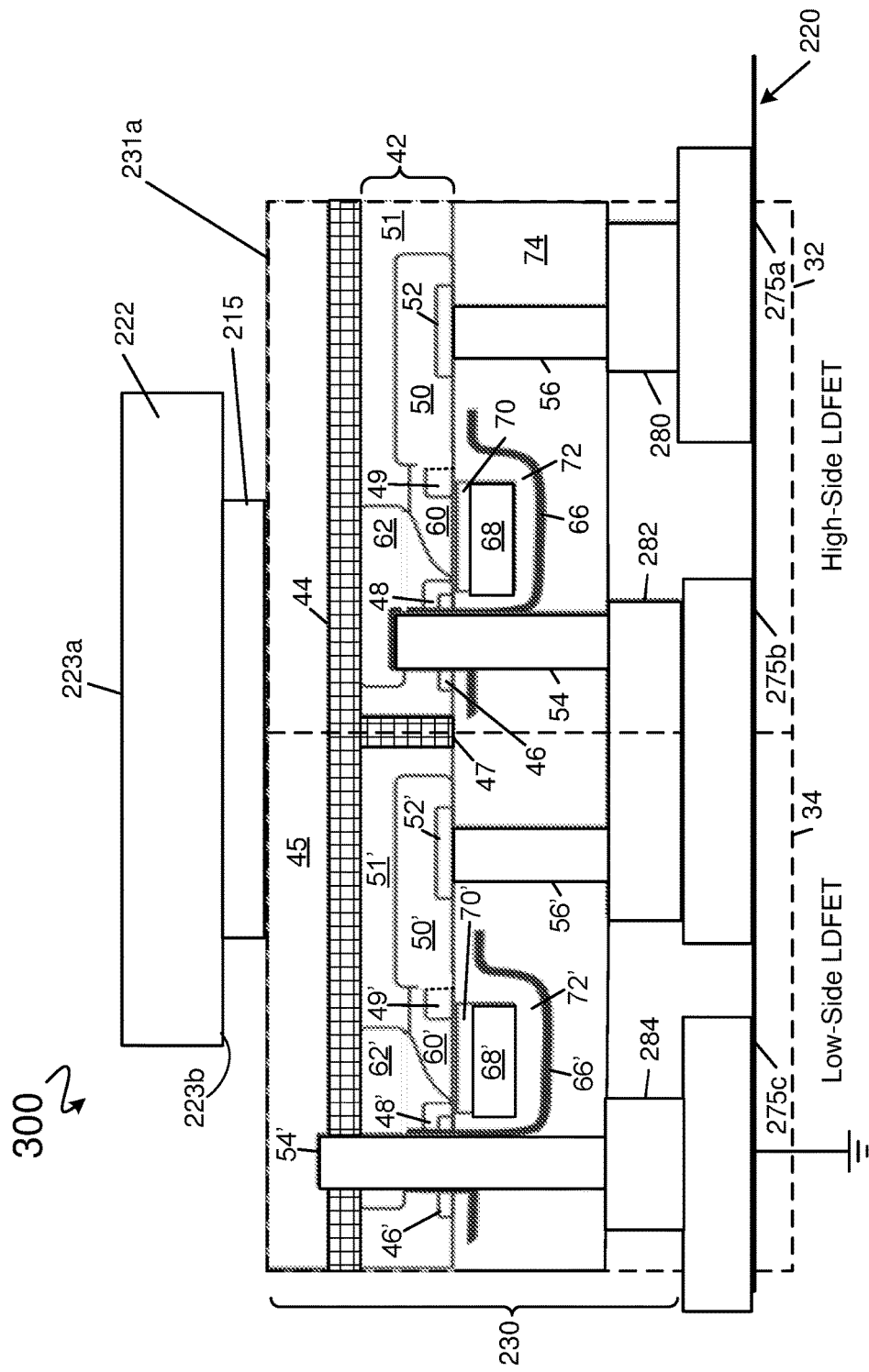
FIG. 3 is a simplified diagrammatic cross-section of an integrated circuit package, in accordance with some embodiments.

FIG. 3 shows a simplified diagrammatic cross-sectional side view of a portion of an integrated circuit (IC) package 300 which includes the elements introduced in FIGS. 2A-C, including the leadframe 220, in accordance with some embodiments. Portions of the leadframe 220, shown in earlier figures, have been omitted for simplicity. For example, the perimeter package leads 291a-h of FIG. 2A, though part of the leadframe 220, have been omitted from FIG. 3.

In the simplified example embodiment shown, the semiconductor die 230 is a power semiconductor die, embodying the high-power semiconductor switch circuit 10 of FIG. 1. In this example, an LDFET 32 implements the high-side FET 12 of the switch circuit 10, and an LDFET 34 implements the low-side FET 14 of the switch circuit 10. In one example configuration, the first frontside electrical contact 280 of the high-side LDFET 32 corresponds to the voltage input node 23 of the switch circuit 10, the second frontside electrical contact 282 corresponds to the phase node 16 of the switch circuit 10, and a substrate 45 (e.g., a handle wafer), electrically connected to the third frontside electrical contact 284, corresponds to the ground node of the switch circuit 10.

A drain region 52 of the LDFET 32 is electrically coupled to a drain contact 56 that is connected to the first frontside electrical contact 280. A source region 46 of the LDFET 32 is electrically coupled to a source contact 54 that is electrically connected to the second frontside electrical contact 282. A drain region 52' of the LDFET 34 is electrically coupled to a drain contact 56' that is electrically connected to the second frontside electrical contact 282. A source region 46' of the LDFET 34 is electrically coupled to the source contact 54' that is electrically connected to the third frontside electrical contact 284. Thus, the substrate 45 of the bottom semiconductor die 230 is electrically coupled to the third frontside electrical contact 284 through the source contact 54'.

The third frontside electrical contact 284 is, in turn, electrically connected to the electrical connector 275c, which is a ground voltage lead of the leadframe 220. By coupling the substrate 45 to ground, a ground plane is formed between the top semiconductor die 222 and the bottom semiconductor die 230, since the substrate 45 is interposed between most, if not all, of the top semiconductor die 222 and the rest of the layers of the bottom semiconductor die 230, thereby minimizing crosstalk between the top semiconductor die 222 and the bottom semiconductor die 230.

In some embodiments, frontside electrical contacts of the top semiconductor die 222 (e.g., the top electrical contacts 224 shown in FIG. 2A) are electrically coupled to gate nodes of the LDFET 32 and/or the LDFET 34 via wire bonds and/or through the leadframe 220. This configuration enables the top semiconductor die 222 to control the on/off state of the high-side LDFET 32 and of the low-side LDFET 34. In some embodiments, the high-side LDFET 32 is a p-type transistor and the low-side LDFET 34 is an n-type transistor. In other embodiments, both of the LDFETs 32, 34 are n-type transistors. In some embodiments, both of the LDFETs 32, 34 are switched simultaneously, either separately with two gate contacts, or together using a single gate contact (e.g., where the gate of the high-side LDFET 32 and the gate of the low-side LDFET 34 are electrically coupled to a single gate contact).

In the example implementation of the high-power semiconductor switch circuit 10 shown in FIG. 3, the drain contact 56 of the high-side LDFET 32 is connected to the voltage input node 23 (with reference to FIG. 1), the source contact 54 of the high-side LDFET 32 and the drain contact 56' of the low-side LDFET 34 are both connected to the phase node 16 (with reference to FIG. 1), and the source contact 54' of the low-side LDFET 34 is connected to the ground node (with reference to FIG. 1). As mentioned above, other node connection arrangements are possible. For example, these other node connection arrangements include any connection arrangements between a first LDFET and a second LDFET that includes (i) a common node that electrically connects to a source of a first LDFET and a drain of a second LDFET, (ii) at least one of the drain of the first LDFET, the source of the second LDFET, and the common node is electrically connected to the semiconductor substrate, and (iii) at least two frontside electrical contacts that are connected to at least two of the drain of the first LDFET, the source of the second LDFET, and the common node that are not electrically connected to the semiconductor substrate.

The high-side and low-side LDFETs 32, 34 are implemented in a frontside active layer 42 of the bottom semiconductor die 230. The substrate 45 is in the backside portion 231a of the bottom semiconductor die 230. The frontside active layer 42 can be any of a doped portion of the bulk of a semiconductor wafer, a localized well formed in a larger doped portion of a semiconductor wafer, an active layer of a semiconductor-on-insulator (SOI) wafer, and a localized well formed in an SOI wafer. In the illustrated example, the frontside active layer 42 is a thin film formed over a buried oxide layer 44 on the substrate 45 (e.g., an SOI substrate). In the illustrated example, a dielectric isolation barrier 47 extends between the high-side and low-side LDFETs 32, 34 from the top of the frontside active layer 42 to the buried oxide layer 44. In some examples, the dielectric isolation barrier 47 is formed using a shallow trench isolation (STI) process.

The high-side LDFET 32 includes the source region 46 formed in a doped region 48, a lightly doped drain (LDD) region 50 with a heavier doped extension region 49 that are formed in a doped region 51, and the drain region 52. The source region 46, the doped region 48, the LDD region 50, the extension region 49, and the drain region 52 can include doped semiconductor material formed by, for example, the implant of impurities into the frontside active layer 42. The doped semiconductor material of each region 46, and 48-52 has a similar conductivity type (e.g., n-type or p-type). Therefore, each region 46, and 48-52 can be formed by the same dopant species, such as through the implant of one kind of dopant atom. The LDD region 50 has a lower dopant concentration than the drain region 52 and may also have a lower dopant concentration than the source region 46. The LDD region 50 provides the LDFET with superior performance as a power device in terms of its ability to hold off large voltages and not degrade while sinking large currents. The presence of the LDD region 50 provides the LDFET with a characteristic of having asymmetric source and drain regions. In some approaches, LDD region 50 generally extends laterally at least twice as far from the drain region 52 as the doped region 48 extends from the source region 46.

The high-side LDFET 32 also includes a body region 60 and a deep well region 62 that have a conductivity type that is opposite the conductivity type of the regions 46, and 48-52. The deep well region 62 extends laterally underneath the source region 46 and the portion of body region 60 in which a channel forms. The deep well region 62 enhances the ability of the high-side LDFET 32 to withstand large voltages and serves to remove unwanted charge carriers from body region 60 to prevent a parasitic bipolar junction transistor from activating during the on state of the high-side LDFET 32.

Above the frontside active layer 42, the high-side LDFET 32 includes a gate structure that includes a gate shield 66 and a gate electrode 68. The gate electrode 68 is electrically insulated from the frontside active layer 42 and the gate shield 66 by dielectric materials 70, 72, respectively.

The drain region 52 can be a highly doped drain region and can form an electrically conductive path between drain contact 56 and LDD region 50. Electrically insulating material 74 (e.g., an interlayer dielectric) electrically isolates and prevents unintended coupling of the electrical components above the frontside active layer 42. In general, the electrically insulating material 74 and the dielectric material 70, 72 may be the same or similar materials. In addition, in certain approaches, the combination of insulating material 74 and dielectric material 70, 72 can be conceptualized as a single insulating layer in the finished device regardless of when and how they are formed.

A conductive path is formed between source contact 54 and drain contact 56 in response to the application of a voltage to gate electrode 68 (e.g., by the top semiconductor die 222). The conductive path between the source contact 54 and the drain contact 56 includes a channel that is selectively formed in the body region 60 under the influence of the aforementioned voltage applied to the gate electrode 68. While the channel is formed, the transistor is said to be on. While the channel is not formed, and there is no conductive path between the source contact 54 and the drain contact 56, the transistor is said to be off. There is no conductive path in this situation because the source region 46 and the drain regions 50, 52 have an opposite conductivity type to body region 60, such that diode junctions are formed at their interfaces.

The gate shield 66 is in ohmic contact with the source contact 54. The gate shield 66 is another feature that makes the high-side FET 32 more amenable to high-power applications. By biasing the gate shield 66 to a given voltage, high-power signals on drain contact 56 are shielded from having an appreciable effect on the gate region. Although the gate shield 66 is illustrated as being ohmically coupled to the source contact 54, the gate shield 66 can also be independently biased. In some examples, the gate shield 66 and the source contact 54 can be formed in two different steps and can comprise two different kinds of material. In this case, however, such features are inconsequential to the operation of the device in most situations because the gate shield 66 and the source contact 54 are one contiguous region of highly conductive material with an uninterrupted ohmic contact from above dielectric material 74 all the way to the surface of the frontside active layer 42. As such, the combination of the gate shield 66 and the source contact 54 can be conceptualized as a single source contact.

In general, the source contact 54 and the drain contact 56 enable electrical connections to the high-side LDFET 32 from other circuitry that may or may not be integrated with the LDFET on the same integrated circuit. The source region 46 can be electrically coupled to the source contact 54 via a silicide layer formed on the surface of the source region 46. More generally, the source region 46 can be coupled to the source contact 54 using any process that forms an ohmic or non-rectifying contact between the two regions of the structure. The connection between the drain contact 56 and the drain region 52 can comprise any of the variations described above with reference to the source contact 54 and the source region 46. The source contact 54 and the drain contact 56 can include a metal, metal alloy, metal silicide, or an electrically conductive semiconductor material such as doped polysilicon. Example metals, metal alloys, and metal silicides can each comprise copper, tungsten, molybdenum, and aluminum.

In the example shown in FIG. 3, some of the elements of the low-side LDFET 34 of the frontside active layer 42 function in similar ways as the corresponding elements of the high-side LDFET 32 of the frontside active layer 42. In this regard, the functionally similar elements of the low-side LDFET 34 are labeled with reference numbers of the corresponding elements of the high-side LDFET 32 that are followed by an apostrophe. For example, a drain region of the low-side LDFET 34 that corresponds to the functionally similar drain region 52 of the high-side LDFET 32 is labeled with reference number 52'. Thus, the low-side LDFET 34 includes the following elements: the source region 46', doped region 48', LDD region 50' with a heavier doped extension region 49' that are formed in a doped region 51', the drain region 52', the source contact 54', the drain contact 56', body region 60', deep well region 62', gate shield 66', gate electrode 68', and dielectric material 70', 72'.

In this example, the source contact 54' of the low-side LDFET 34 not only extends from above the frontside active layer 42, through the source and doped regions 46', 48' to the deep well region 62', but it also extends through the deep well region 62' and the buried oxide layer 44 and into the substrate 45. In this way, the source contact 54' of the low-side LDFET 34 provides a source-down electrical connection to the substrate 45 and thereby to the substrate 45, which corresponds to the ground node for the high-power semiconductor switch circuit 10.

The second frontside electrical contact 282 (the phase node) electrically interconnects the source contact 54 of the high-side LDFET 32 with the drain contact 56' of the low-side LDFET 34 and, thereby, forms a common node for the source region 46 of the high-side LDFET 32 and the drain region 52' of the low-side LDFET 34. It is noted that the buried oxide layer 44 and the dielectric isolation barrier 47 electrically isolate the high-side LDFET 32 from the substrate 45 to prevent the formation of a common node with the source contact 54' of the low-side LDFET 34 during operation of the power switch circuit 10.

The semiconductor die 230 is mounted on and within portions of the leadframe 220 of the IC package 300. As shown, the first frontside electrical contact 280 of the bottom semiconductor die 230 is electrically coupled to and physically mounted to the electrical connector 275a (an input voltage node lead of the leadframe 220), the second frontside electrical contact 282 is electrically coupled to and physically mounted to the electrical connector 275b (a phase node lead of the leadframe 220), and the third frontside electrical contact 284 is electrically coupled to and physically mounted to the electrical connector 275c (the ground voltage lead of the leadframe 220).

Additional electrical connections between the top semiconductor die 222 and the bottom semiconductor die 230, similar to those shown in FIG. 2A-C, are made but are omitted in FIG. 3 for simplicity.

The backside 223b of the top semiconductor die 222 is physically mounted to the backside portion 231a of the bottom semiconductor die 230. The backside portion 231a, which includes the substrate 45, is coupled to electrical connector 275c (the ground voltage lead) of the leadframe 220. This advantageously creates a ground plane between the top semiconductor die 222 and the bottom semiconductor die 230 to minimize crosstalk between these dice.

Metal layers (e.g., the first frontside electrical contact 280) shown in FIG. 3 generally represent multiple metal layers that route connections as needed, including top metal layers for semiconductor die pads and additional metal layers between the semiconductor die pads and the insulating material (e.g., 74) of the frontside active layer 42. Some metal layers, connections, bond-wires, or other features have been omitted for simplicity. Intervening metal layers, conductive adhesive, copper pillars, solder bumps, or other metal bonding structures may be present.

The simplified diagrammatic cross-sectional side view shows only a single transistor "finger" for simplicity. In some embodiments, multiple transistor fingers are connected in parallel to increase the power handling capability of the embodied circuit and to reduce total resistance as required by the application of the embodied circuit.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
providing a leadframe having perimeter package leads and a ground voltage lead;
forming a bottom semiconductor die comprising: i) a first frontside active layer having first frontside electrical contacts, ii) a first backside portion, and iii) a buried oxide layer, the buried oxide layer being situated between the first frontside active layer and the first backside portion;
flip-chip mounting the bottom semiconductor die to the leadframe, the flip-chip mounting comprising electrically connecting and physically mounting the first frontside electrical contacts of the bottom semiconductor die to the leadframe, a first electrical contact of the first frontside electrical contacts being electrically connected and physically mounted to the ground voltage lead of the leadframe;
providing a top semiconductor die, the top semiconductor die comprising: i) a second frontside having second frontside electrical contacts, and ii) a second backside; and
mounting the top semiconductor die to the bottom semiconductor die, the second backside of the top semiconductor die being attached to the first backside portion of the bottom semiconductor die;
wherein:
the first frontside active layer of the bottom semiconductor die comprises a circuit electrically connected to the first frontside electrical contacts by respective first frontside electrical connections and electrically connected to the first backside portion by a first backside connection through the buried oxide layer; and
the first backside portion of the bottom semiconductor die is electrically connected to the ground voltage lead of the leadframe through the first backside connection and the first electrical contact of the first frontside electrical contacts to minimize crosstalk.

2. The method of claim 1, wherein:
an electrical contact of the second frontside electrical contacts of the top semiconductor die is electrically coupled to a first set of the perimeter package leads.

3. The method of claim 1, wherein:
the bottom semiconductor die comprises two or more transistors;
at least one of the two or more transistors is electrically connected to the first frontside electrical contacts of the bottom semiconductor die; and
at least one of the two or more transistors is electrically connected to the first backside portion of the bottom semiconductor die.

4. The method of claim 3, wherein:
the two or more transistors comprise a high-side transistor and a low-side transistor;
the high-side transistor comprises a high-side source, a high-side drain, and a high-side gate;
the low-side transistor comprises a low-side source, a low-side drain, and a low-side gate; and
the first backside portion of the bottom semiconductor die is electrically connected to the low-side source through the buried oxide layer.

5. The method of claim 4, wherein:
a top electrical contact of the second frontside electrical contacts of the top semiconductor die is electrically connected to one or both of the high-side gate or the low-side gate.

6. The method of claim 5, wherein:
the top electrical contact is electrically connected to the one or both of the high-side gate or the low-side gate through a perimeter package lead of the perimeter package leads of the leadframe.

7. The method of claim 4, wherein:
the first electrical contact of the first frontside electrical contacts of the bottom semiconductor die is electrically connected to the low-side source.

8. The method of claim 7, wherein:
a second electrical contact of the first frontside electrical contacts of the bottom semiconductor die electrically couples the low-side drain to the high-side source; and
the second electrical contact is electrically coupled and physically mounted to a phase node lead of the leadframe.

9. The method of claim 8, wherein:
a third electrical contact of the first frontside electrical contacts of the bottom semiconductor die is electrically coupled to the high-side drain; and
the third electrical contact is electrically coupled and physically mounted to an input voltage node lead of the leadframe.

* * * * *